US005506530A

United States Patent [19]
Bouvier

[11] Patent Number: 5,506,530
[45] Date of Patent: Apr. 9, 1996

[54] METHOD FOR PROMOTING ACTIVATION OF A PHASE-LOCKED LOOP AND CORRESPONDING LOOP

[75] Inventor: Jacky Bouvier, Meylan, France

[73] Assignee: France Telecom, Paris, France

[21] Appl. No.: 230,172

[22] Filed: Apr. 20, 1994

[30] Foreign Application Priority Data

Apr. 20, 1993 [FR] France ................... 93 04609

[51] Int. Cl.⁶ .................................. H03L 7/199
[52] U.S. Cl. ................. 327/150; 327/147; 375/376; 331/34; 331/1A
[58] Field of Search ................. 327/144, 145, 327/147, 150, 151, 156, 159, 160, 163, 231, 283, 236, 244, 552; 377/37; 331/34, 1 A, 20, 14, DIG. 2; 375/376, 362

[56] References Cited

U.S. PATENT DOCUMENTS

| | | | |
|---|---|---|---|
| 4,309,662 | 1/1982 | Baudoux | 327/156 |
| 4,812,783 | 3/1989 | Honjo et al. | 331/20 |
| 4,843,469 | 6/1989 | Boyce | 348/546 |
| 5,248,904 | 9/1993 | Miyazaki et al. | 327/113 |
| 5,257,294 | 10/1993 | Pinto et al. | 331/1 A |
| 5,304,954 | 4/1994 | Saito et al. | 331/1 A |

FOREIGN PATENT DOCUMENTS

| | | |
|---|---|---|
| 0012899 | 7/1980 | European Pat. Off. |
| 0258042 | 3/1988 | European Pat. Off. |
| 0389894 | 10/1990 | European Pat. Off. |
| 2932049 | 2/1981 | Germany . |

Primary Examiner—Timothy P. Callahan
Assistant Examiner—Dinh T. Le
Attorney, Agent, or Firm—Robbins, Berliner & Carson

[57] ABSTRACT

The phase-locked loop includes means (3) for generating an internal signal (SIN) drawn from the output signal of the voltage-controlled oscillator (2), and a phase comparator (4) able to compare the phase of the internal signal (SIN) with that of an external signal received (SSY), and the output of which is looped back onto the voltage-controlled oscillator (2). It further comprises a device (6) accelerating the synchronization of the internal and external signals, including processing means able to receive, from the phase comparator (4), a predetermined indication representative of the non-coincidence of the internal and external signals, and, in response to this predetermined indication, to deliver control information in response to which the generation means (3) modify the phase of the internal signal in order to force the latter substantially into phase with the external signal (SSY).

14 Claims, 3 Drawing Sheets

5,506,530

METHOD FOR PROMOTING ACTIVATION OF A PHASE-LOCKED LOOP AND CORRESPONDING LOOP

BACKGROUND OF THE INVENTION

1. Field of the Invention

The invention relates to phase-locked loops, especially those including a quartz oscillator as variable-frequency, voltage-controlled oscillator.

2. Description of the Related Art

A phase-locked loop conventionally includes a phase comparator, the two inputs of which respectively receive an external signal generally having the function of synchronizing signal, and an internal signal to be synchronized, coming from the output signal of the voltage-controlled oscillator. The phase comparator is furthermore looped back at the output of this oscillator by use of a filter. Such a phase-locked loop is activated upon the coincidence of the transitions between the synchronizing signal and the signal to be synchronized.

The general object of the invention is to promote activation of a phase-locked loop by accelerating the synchronization of the two external and internal signals.

SUMMARY OF THE INVENTION

The invention applies in a particularly advantageous way to phase-locked loops including a quartz oscillator, the frequency variations of which are typically of the order of ±100 ppM, and having to be synchronized to an external signal having a frequency which is a sub-multiple of the nominal frequency of the quartz oscillator in a ratio of the order of 1000 or more. In fact, on applying voltage to the loop, when the two signals to be synchronized appear, namely the external signal and the signal coming from the divider placed between the phase comparator and the oscillator, the transitions of these two signals take place at random instants and the first coincidence may take place, as it happens, more than a second after the voltage is applied. The object of the invention is thus to force the first coincidence in a time scale which is at most equal to two periods of the external, or synchronizing, signal.

The object of the invention is furthermore to achieve this objective essentially on the basis of logic elements.

Thus, first of all, the subject of the invention is a method for promoting activation of a phase-locked loop, in which:

a) the phase of the external signal received is compared with that of the internal signal drawn from the output signal of the voltage-controlled oscillator of the loop, and b) in response to a predetermined indication representative of phase non-coincidence between the two signals, the phase of the internal signal is modified so as to force the latter substantially into phase with the external signal.

According to one embodiment of the method according to the invention, in which the loop includes a divider, linked to the output of the voltage-controlled oscillator, and able to deliver the said internal signal, the divider is reinitialized in the presence of the said predetermined indication in order to force a quasi-coincidence between a transition of the internal signal and a transition of the external signal.

It is also preferable, particularly so as not to disturb the operation of the phase-locked loop, that, after having forced the two signals to be synchronized into phase, any action on the means generating, such as the divider, of generating the internal signal is inhibited for a predetermined duration, even in the presence of another indication representing phase non-coincidence between the two signals, and that phase b) is then repeated in the presence of a new predetermined indication.

According to one embodiment of the method, the phase comparator is made to deliver a non-coincidence signal, representative of a phase non-coincidence between the two signals, and the non-coincidence signal is filtered, the said predetermined indication then being the value of this filtered non-coincidence signal. It is thus possible to filter the brief spurious transitions which can occur even if the two signals are in phase.

According to a preferred embodiment of the method, the means of generating the internal signal are acted upon in a time scale at most equal substantially to two periods of the external signal, while any non-coincidence signal, having a duration less than one period of the clock signal of the voltage-controlled oscillator is filtered.

The subject of the invention is also a phase-locked loop, including means of generating an internal signal drawn from the output signal of the voltage-controlled oscillator, and a phase comparator able to compare the phase of the internal signal with that of an external signal received and the output of which is looped back onto the voltage-controlled oscillator. According to one general characteristic of the invention, the loop furthermore comprises a device accelerating the synchronization of the internal and external signals, including processing means able to receive, from the phase comparator, a predetermined indication representative of the non-coincidence of the internal and external signals, and, in response to this predetermined indication, to deliver control information in response to which the generation means modify the phase of the internal signal in order to force the latter substantially into phase with the external signal.

According to one embodiment in which the generation means include a divider arranged between the output of the voltage-controlled oscillator and one input of the phase comparator, this divider delivering the said internal signal formed by a periodic succession of transitions, the control information is a control signal for initialization of the divider, sent substantially in coincidence with a transition of the external signal, the divider, in response, sending a transition of the internal signal substantially in coincidence with the said transition of the external signal.

The processing means advantageously possess a rest state in the absence of predetermined indication originating from the phase comparator, an active state in which, in the presence of a predetermined indication originating from the phase comparator, they deliver the said control information to the means of generating the internal signal, and a time delay state in which they are inactive with respect to the control of the generation means, even in the presence of a new predetermined indication originating from the phase comparator. Furthermore the device advantageously includes sequencing means able to make the processing means pass from their rest state to their active state then to their time delay state and to their rest state in time with the transitions of the external signal.

According to one embodiment of the invention, the processing means include:

a sequencer counter, sequenced in time with the transitions of the external signal, and capable of cyclically delivering a set of different count values associated with the different states of the processing means, a first logic assembly linked to the output of the counter and capable of delivering a control pulse in response to a predetermined count value associated with the working state, a second logic assembly linked, on the one hand, to the output of the first logic assembly and, on the other hand, to the external signal input in order, in response to the said control pulse, to deliver the said control information substantially in coincidence with a transition of the external signal.

The phase comparator is advantageously capable of delivering a signal of phase non-coincidence of the internal and external signals, and the device then preferably includes a filter able to filter the non-coincidence signals having a duration less than a predetermined duration, the said predetermined indication being the value of the filtered non-coincidence signal.

The subject of the invention is also a device for accelerating the synchronization of the internal and external signals of a phase-locked loop of the type of that which has just been set out.

BRIEF DESCRIPTION OF THE DRAWINGS

Other advantages and characteristics of the invention will be apparent on examining the detailed description of an embodiment of the invention which is in no way limiting, illustrated in the attached drawings in which.

DESCRIPTION OF THE PREFERRED EMBODIMENTS

Figure 1:
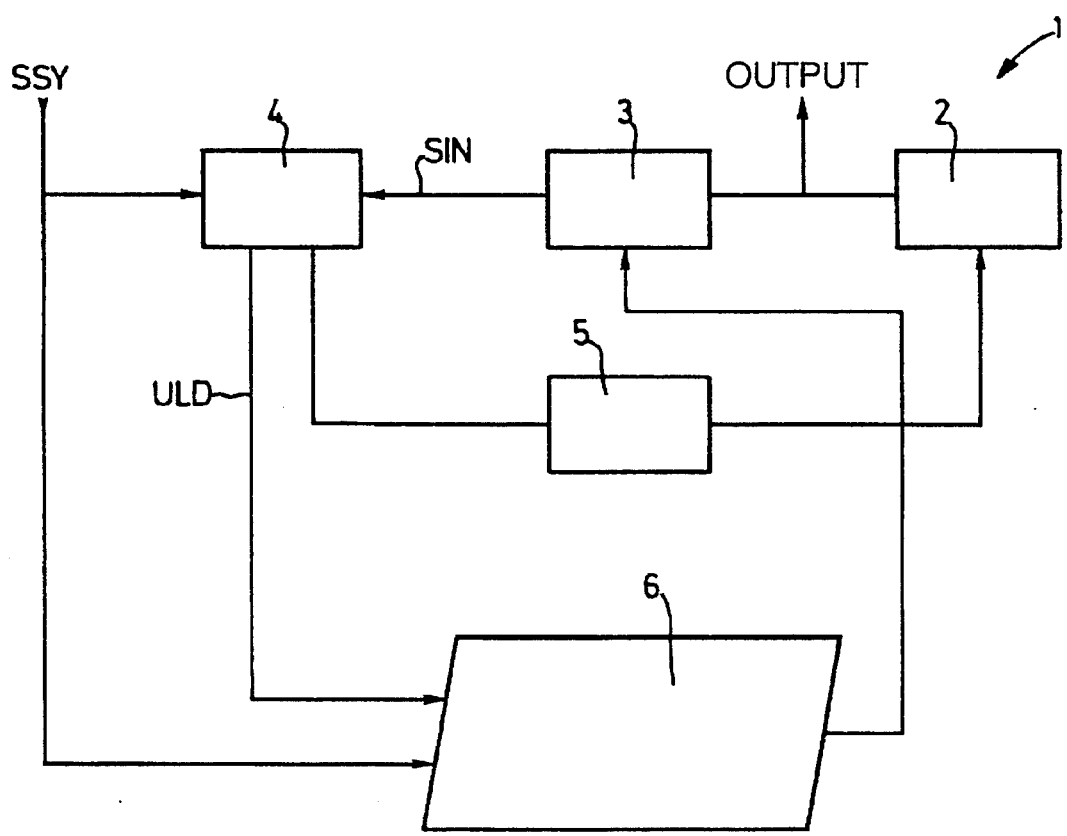
FIG. 1 is a diagrammatic representation of a phase-locked loop equipped with a device according to the invention.

As illustrated in FIG. 1, the phase-locked loop 1 includes a variable-frequency, voltage-controlled quartz oscillator 2. The output of this oscillator, which is also the output of the phase-locked loop, is linked moreover to the input of a high-value divider 3, the output of which is linked to one of the inputs of the phase comparator 4 of the loop. The other input of this phase comparator is linked to an external signal input SSY which acts here as synchronizing signal. The output of the phase comparator is looped back onto the oscillator 2 by use of a filter 5.

In the case, for example, of an oscillator 2 centred on a frequency of 27,000 kHz and having to be synchronized to an external synchronizing signal SSY having a frequency of 15.625 kHz, the division factor N of the divider 3 is then 1728. If it is assumed that this oscillator 2 has a frequency variation $\Delta f$ of the order of $\pm 2$ kHz, the slipping frequency of the synchronizing signal SSY with respect to the signal to be synchronized SIN, coming from the divider 3, is equal to the ratio $\Delta f/N$, i.e. 1.15 Hz which corresponds to a period of the order of 0.87 seconds which may turn out, in an unfavourable case, to be the time delay before synchronization of the two signals and thus before activation of the phase-locked loop.

The object of the invention is to bring this time delay back to two periods of the synchronizing signal, i.e., in the present case, to 128 μs at the maximum, and to do so by adding a device 6 for accelerating the synchronization of the internal SIN and external SSY signals. As illustrated in FIG. 1, this device 6 receives, as input, on the one hand, the synchronizing signal SSY and, on the other hand, a non-coincidence signal ULD, coming from the phase comparator 4 and representative of a non-coincidence between the transitions of the SIN and SSY signals. The output of this device 6 acts, as will be seen later in more detail, directly on the initialization command of the divider 3.

A person skilled in the art will note that the oscillator 2, divider 3, phase comparator 4 and filter 5 of the phase locked-loop are conventional components, the structure and operation of which are well known in the art. In particular, a person skilled in the art will recognize that the phase comparator 4 includes two inputs (SSY, SIN), two outputs to the filter (PUMP UP, PUMP DOWN), and a non-coincidence output (ULD). When the two input signals SSY and SIN are in phase, each transition of one signal is simultaneously with each corresponding transition of the other signal at the two inputs of the phase comparator 4. Consequently, the two output signals of the phase comparator 4, PUMP UP and PUMP DOWN, have a zero volt tension or a logical value 0.

When the two input signals, SSY and SIN, are not in phase, a transition of one of the signals is received by the phase comparator 4 in advance with respect to the corresponding transition of the other signal. Consequently, one of the output signals, for example the PUMP UP output, takes a 5 volts tension or the logical value 1 and maintains this value until the corresponding transition of the other input signal is received at the other input. The same effect occurs on the other output, for example the PUMP DOWN output, when one input signal is delayed with respect to the other input signal.

The two output signals, PUMP UP and PUMP DOWN, of the phase comparator 4 are connected through the filter 5 to the voltage controlled input of the oscillator 2. The oscillator 2 can thus be tuned by the signal from the filter 5. In particular, the PUMP UP signal modifies the frequency of the oscillator 2 in one sense and the PUMP DOWN signal modifies the frequency of the oscillator 2 in the other sense.

A non-coincidence signal (ULD) is generated by the phase comparator 4 and applied to the accelerating device 6 when there is a non-coincidence between the two input signals SSY and SIN (i.e., when one of the PUMP UP or PUMP DOWN signals is in its high state).

Figure 2:
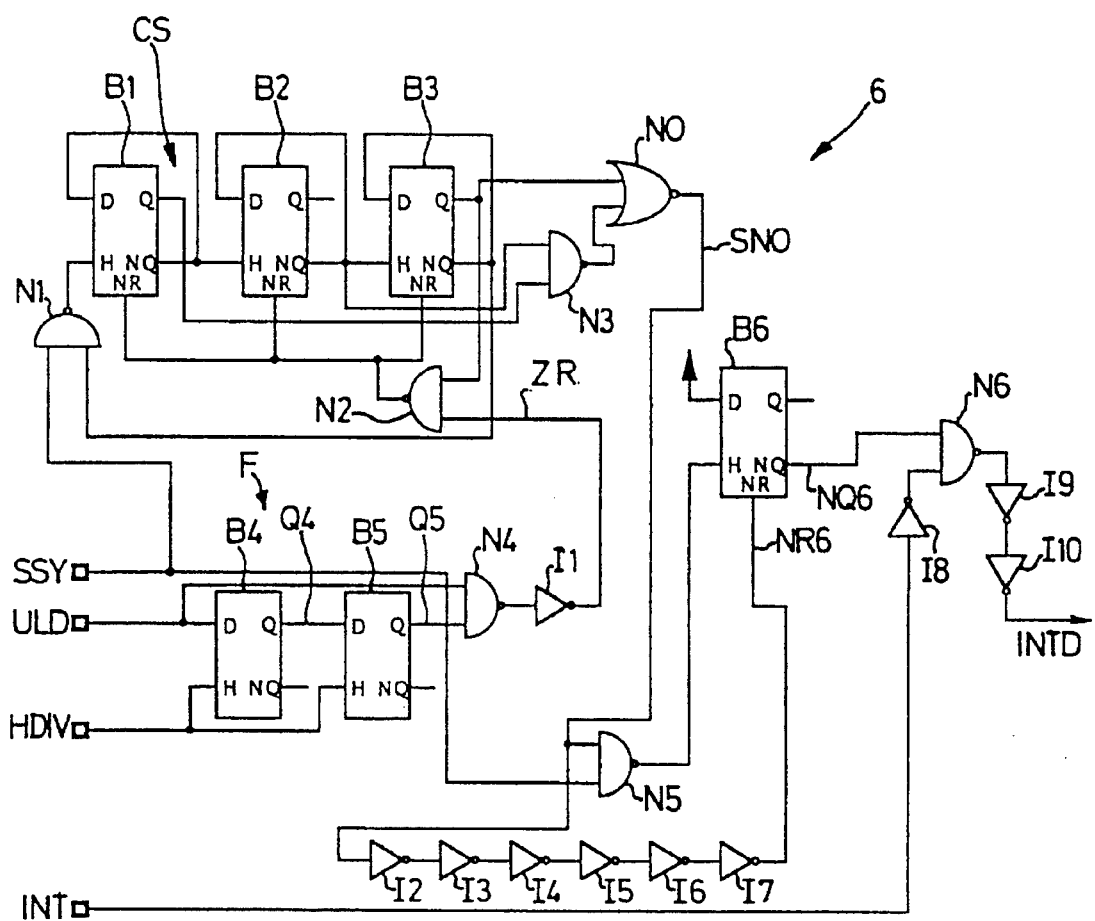
FIG. 2 is a more detailed diagrammatic block diagram of the device of FIG. 1, and FIGS. 3 and 4 represent time-based timing diagrams relating to the operation of the device of FIG. 2.

As illustrated in FIG. 2, the device 6 includes a sequencer counter CS here formed by three D-type flip-flops, referenced B1, B2, B3, and mounted in cascade. More precisely, the input D of each flip-flop is looped back onto the complemented output NQ (or $\overline{Q}$) of the latter. Moreover, the complemented output NQ of the first flip-flop B1 is linked to the clock input H of the second flip-flop B2 and the complemented output NQ of this second flip-flop B2 is linked to the clock input H of the third flip-flop B3. This sequencer counter is sequenced, as will be seen later, at the rate of the transitions of the synchronizing signal SSY, by sequencing means here including a first NAND logic gate referenced N1 and a second NAND logic gate referenced N2. One of the inputs of the gate N1 is linked to the synchronizing signal SSY input while the other input of this gate N1 is linked to the complemented output NQ of the third flip-flop B3. The output of this logic gate N1 is linked to the clock input H of the first flip-flop B1.

One input of the logic gate N2 is linked to the non-complemented output Q of the flip-flop B3 while the other input of this logic gate N2 is linked to the output of a filter F, the structure and the operation of which will be dealt with in more detail later. The output of this logic gate N2 is linked to all the zero-reset inputs NR of the three flip-flops B1, B2, B3 of the sequencer counter CS.

The processing means of the device 6 include, in addition to the sequencer counter CS, a first logic assembly linked to the output of the counter and, as will be seen later, capable of delivering a control pulse in response to a predetermined count value delivered by the counter. More precisely, this first logic assembly includes a third NAND logic gate referenced N3, the two inputs of which are linked respectively to the non-complemented Q and complemented NQ outputs of the first and second flip-flops B1 and B2. This logic assembly also includes a NOR logic gate, referenced N0, the two inputs of which are linked respectively to the output of the third logic gate N3 and to the non-complemented output Q of the third flip-flop B3 of the sequencer counter CS. The output of this logic gate N0 forms the output of this first logic assembly and is capable of delivering a logic signal SN0, the passage of which to the high state, as will be seen later, will represent the said control pulse.

The output of the NOR logic gate is linked to an input of a fourth NAND logic gate referenced N5, belonging to a second logic assembly capable, in response to the said control pulse sent out by the NOR logic gate, of delivering control information for initialization of the divider, substantially in coincidence with a transition of the external signal.

This second logic assembly receives the synchronizing signal SSY via the other input of the gate N5. It moreover comprises a fourth D-type flip-flop, referenced B6, the input D of which is forced to the high state and the clock input H of which is linked to the output of the gate N5. Moreover, the output of the NOR logic gate, referenced N0, is also linked to the zero-reset input NR of the flip-flop B6 via a delay circuit, here consisting of 6 inverters I2–I7 mounted in series.

The complemented output NQ of this flip-flop B6 is linked to a first input of a fifth NAND logic gate referenced N6, the other input of which is capable, via an inverter I8, of receiving the internal initialization signal INT of the divider. The output of this gate N6 delivers the initialization control signal INTD to the divider 3 of the loop, via two successive inverters I9 and I10.

The filter F includes a fifth D-type flip-flop referenced B4 and a sixth D-type flip-flop referenced B5 mounted in cascade. The input D of the flip-flop B4 receives the signal ULD coming from the phase comparator, while the input D of the flip-flop B5 is linked to the non-complemented output Q of the flip-flop B4. These two flip-flops are sequenced on their clock inputs H by the clock signal HDIV from the voltage-controlled oscillator of the loop.

The non-complemented output Q of the flip-flop B5 is linked to an input of a sixth NAND logic gate referenced M4, the other input of which moreover directly receives the non-filtered non-coincidence signal ULD. The output of this gate N4 is linked via an inverter I1 to the other input of the logic gate N2.

Figure 3:
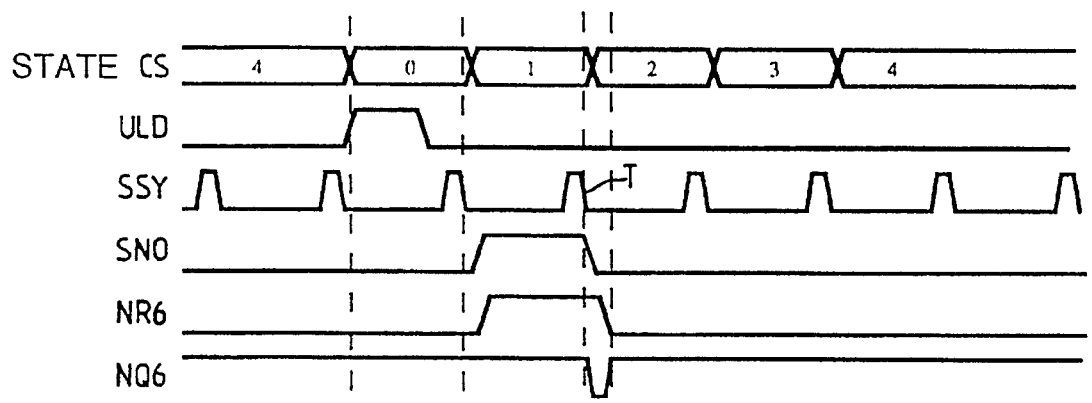

The operation of the accelerator device 6 will now be described in detail, referring more particularly to the timing diagrams represented in FIGS. 3 and 4.

For the study of this operation, and for purposes of simplification, the various signals delivered by the outputs of the flip-flops will be referenced with the same references as the corresponding outputs of these flip-flops, assigned the number of the flip-flop in addition. Hence, for example, the signal delivered by the complemented output NQ of the flip-flop B2 will be assigned the reference NQ2. Likewise, the signal delivered by the non-complemented output Q of the flip-flop B3 will be assigned the reference Q3 and the signal received at the zero-reset input NR of the flip-flop B6 will be referenced NR6.

In the absence of a signal ULD, the processing means are in a rest state corresponding to a count value equal to 4 of the sequencer counter CS. This count value corresponds to a binary word 100 which corresponds respectively to the values of output signals Q3, Q2 and Q1 of the flip-flops B3, B2 and B1. Consequently, the output signal NQ3 of the flip-flop B3 is in the low state (value equal to zero). In the absence of a signal ULD, the two inputs of the logic gate N4 are at zero, which translates into an output equal to 1 and thus a value of the signal ZR equal to zero. Consequently, the output of the logic gate N2 is equal to 1.

The two inputs of the logic gate N3 are respectively at 1 and at 0, which has the consequence of placing the two inputs of the logic gate N0 at 1 and consequently the value of the output signal SN0 at 0.

Since one of the inputs of the logic gate N5 is at 0, its output is held at 1, as is the value of the signal NQ6 of the flip-flop B6.

Since one of the inputs of the logic gate N1 is equal to 0, by reason of the value of the output signal NQ3 of the flip-flop B3, the output of this logic gate N1 remains held at 1. In consequence, the sequence counter remains turned-off in this rest state even upon the appearance of a transition of the synchronizing signal, since the clock input of the flip-flop B1 does not change state. In consequence, in this rest state, the output of the logic gate N6 will change state in time with pulses of the internal initialization signal of the divider INT.

Let us assume now that the phase comparator delivers a non-coincidence signal ULD and that the latter is not filtered by the filter F. In this case, the processing means of the device 6 will change state and pass into an active state. In effect, with the two inputs of the logic gate N4 at 1, its output passes to 0 and thus the value of the signal ZR is equal to 1. Since, that being so, the two inputs of the logic gate N2 are at 1, its output passes to 0 and is applied to the three inputs NR of the flip-flops B1, B2, B3. In consequence, the output signals Q1, Q2 and Q3 of the flip-flops B1, B2 and B3 pass to 0 which corresponds to a count value of the sequencer counter CS equal to zero.

In consequence, since the right-hand input on FIG. 2 of the logic gate N1 has passed to 1, the sequencer counter CS will keep this read-out value until the rising edge of the following transition of the synchronizing signal SSY. Upon the occurrence of this transition of the SSY signal, the clock signal of the flip-flop B1 passes to the low state (value 0) and will keep this value until the falling edge of the transition of the signal SSY. Upon this falling edge, the clock signal of the flip-flop B1 passes back to the high state (value 1), and, since the flip-flops B1, B2, B3 have been chosen to count on the rising edges of the clock signals, the output Q of this flip-flop B1 passes to the 1 state, which corresponds to a count value of the sequencer counter equal to 1, since the outputs Q of the other two flip-flops B2 and B3 have remained unchanged and equal to 0.

In this count state, 1, of the sequencer counter CS, the two inputs of the logic gate N3 are at 1, and, consequently, the two inputs of the logic gate N0 are at 0 which confers the value 1 on the output signal SN0.

In consequence, the input signal NR6 of the flip-flop B6 also passes to 1 with a time delay due to the inverters I1, I7. However, the output of the logic gate N5 remains equal to 1 and, in consequence, so does the output signal NQ6 of the flip-flop B6, since, although the input of the logic gate N5 receiving the signal SNO has passed to 1, the other input of this gate N5 has fallen to the low state (value 0) on the falling edge of the transition of the synchronizing signal SSY.

Upon the falling edge of the following transition of the synchronizing signal SSY, the sequencer counter CS again changes state this time indicating the count value 2 corresponding to the values 0 1 0 delivered respectively at the outputs Q of the flip-flops B1, B2 and B3.

Upon the falling edge of this transition T of the synchronizing signal SSY, the output signal SNO of the logic gate NO has fallen back to the low state which has had the consequence of making the clock signal H of the flip-flop B6 pass back to the high state, this clock signal having fallen back before to the low state upon the appearance of the rising edge of this transition of the synchronizing signal SSY. In consequence, since a rising edge of the clock signal of the flip-flop B6 is then present, the latter changes state and the output signal NQ6 passes to the low state (value 0). This signal NQ6 keeps the low value until the signal NR6 falls back to the zero value, which occurs with a delay, having regard to the inverters I2–I7, with respect to the fall back of the signal SNO. In consequence, the value of this delay conditions the duration of the signal NQ6 in the low state, and thus the duration of the control pulse delivered to the logic gate N6. Upon this control pulse, the value of the signal INTD is equal to 1 which forces reinitialization of the divider of the phase-locked loop and thus causes the internal signal to be forced substantially into phase by sending a transition of this internal signal.

A person skilled in the art will note that the forced transition sent by the divider of the oscillator is thus substantially in coincidence with the transition T of the signal SSY which has caused the sending of the control pulse NQ6. The synchronization of the two signals thus takes place here in this embodiment on the falling edges of the transitions of the synchronizing signal SSY. This forcing into phase is thus performed at the end of a time delay equal to two periods of the synchronizing signal SSY.

The passage of the sequencer counter from the count value 1 to the count value 2 marks the end of the active state of the processing means and the start of a state called "time delay" in which, even in the presence of a further arrival of a non-coincidence signal ULD, no control pulse will be delivered to the divider of the oscillator. The time delay duration, in this embodiment, has been taken to be equal to two periods of the synchronizing signal SSY, and, in a general way, is for the purpose of not disturbing the operation of the phase-locked loop which has been engaged at the completion of the state 1 of the sequencer counter CS.

More precisely, in this embodiment, the sequencer counter, after having passed into the count state 2, will, after the occurrence of the following transition of the synchronizing signal SSY, indicate the count value 3 corresponding to the values 1 1 0 of the outputs Q of the flip-flops B1, B2, B3. The presence of a signal ULD during this time-delay state remains without effect since the input of the logic gate N2 linked to the Q output of the flip-flop B3, in this time-delay state, remains at the value 0.

Upon the appearance of the following transition of the synchronizing signal SSY, the sequencer counter comes back into the state 4 (count value equal to 4 corresponding to the values 0 0 1 of the outputs Q of the flip-flops B1, B2, B3). It remains in this state if no new predetermined indication representative of the non-coincidence of the two internal and external signals appears. In contrast, in the presence of a new non-filtered non-coincidence signal ULD, the cycle recommences.

The predetermined indication in response to which the sequencer counter passes from the count state 4 to the count state 0 consists of the filtered non-coincidence signal ULD. In fact, it has appeared to be particularly advantageous, particularly so as not to disturb the operation of the phase-locked loop, to filter the brief spurious transitions which could be sent by the phase comparator even when the two signals to be synchronized are in phase. Thus, the filter F is for the purpose of filtering any signal ULD having a duration less than one period of the clock signal HDIV of the voltage-controlled oscillator.

Figure 4:
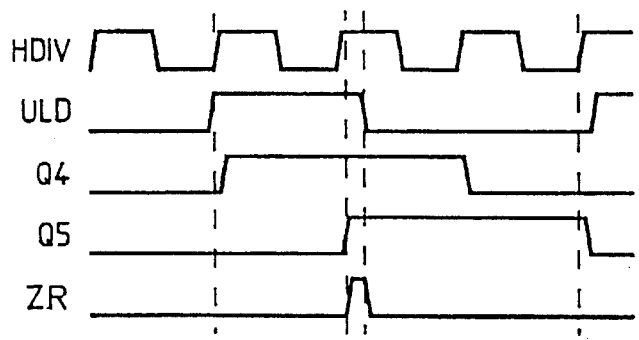

FIG. 4 illustrates a time-based timing diagram on which it has been assumed that the signal ULD had a duration slightly greater than one period of the clock signal HDIV. It should be noted that the time scales of this timing diagram are completely different from those of the timing diagram of FIG. 3.

At the rising edge of the clock signal HDIV, the output signal Q4 of the flip-flop B4 passes to 1 and remains in this state for a duration equal to two periods of this clock signal HDIV. At the following rising edge of the clock signal HDIV, the output signal Q5 of the flip-flop B5 passes to the high state and remains there during two periods of the clock signal HDIV. Since the signal ULD is still at the state 1 during the passage to the high state of the output signal Q5, the output of the logic gate N4 passes to zero and consequently the signal ZR driving the second input of the logic gate N2 passes to the state 1. This signal ZR has kept the value 1 up to the falling edge of the signal ULD.

If, in contrast, the signal ULD had a duration less than one period of the clock signal, that is to say if its falling edge had appeared before the rise in the signal Q5 to the state 1, the output of the logic gate N4 would have remained at 1 and, consequently, the output signal ZR would have remained at the value zero, which would not have caused the processing means to pass from their rest state to their active state.

I claim:

1. A method for accelerating activation of a phase-locked loop, comprising the steps of:

a) comparing a phase of an external signal received by the phase-locked loop with a phase of an internal signal output from a voltage controlled oscillator of the phase-locked loop using a phase comparator, b) modifying the phase of the internal signal in response to the external signal and a predetermined indication from said phase comparator representative of phase non-coincidence between the external and internal signals to force the internal signal substantially into phase with the external signal, wherein said phase-locked loop includes a variable divider for generating said internal signal and said step of modifying the phase of the internal signal further comprises the step of reinitializing said variable divider in response to said predetermined indication to force a transition of the internal signal substantially in coincidence with a transition of the external signal, c) inhibiting action of the internal signal for a predetermined duration after having forced the external and internal signals into phase, even when another indication representing a non-coincidence is present, and d) repeating, after said predetermined duration, said modifying step in the response to a new predetermined indication representative of phase non-coincidence.

2. The method according claim 1, further comprising the steps of:

generating a non-coincidence signal from a phase comparator to represent said phase non-coincidence between the external and internal signals; and filtering the non-coincidence signal to provide said predetermined indication.

3. The method according to claim 2, wherein said filtering step filters non-coincidence signals which have a duration less than one period of the clock signal which clocks the voltage-controlled oscillator.

4. The method according to claim 1, wherein the modifying step is performed within two periods of the external signal.

5. A phase-locked loop, comprising:

means, including a voltage-controlled oscillator coupled to means for modifying the phase of an internal signal in response to control information to force the internal signal substantially into phase with an external signal, for generating an internal signal, a phase comparator for comparing a phase of the internal signal with a phase of an external signal received by said phase-locked loop to provide an output, said output being applied to the voltage-controlled oscillator, means for accelerating synchronization of the internal signal with the external signal, said accelerating means being coupled to said external signal and phase comparator and modifying means, said accelerating means comprising processing means responsive to a predetermined indication from said phase comparator for generating control information, said predetermined indication representative of phase non-coincidence between the internal and external signals, wherein the processing means is in a rest state when the predetermined indication originating from the phase comparator is absent, and in an active state in which the processing means delivers the control information to the internal signal generating means when a predetermined indication of phase non-coincidence is present, and in a time-delay state in which the processing means is inactive with respect to control of the internal signal generating means, even when a new predetermined indication originating from the phase comparator is present, and wherein said phase-locked loop further includes sequencing means for causing the processing means to pass from the rest state to the active state, the time-delay state and then the rest state in response to transitions of the external signal.

6. The phase-locked loop according to claim 5, wherein said internal signal generating means comprises a divider for generating said internal signal, and wherein the control information includes a control signal for initialization of the divider, said control signal being generated substantially in coincidence with a transition of the external signal and wherein the divider, in response to said control signal, causes transition of the internal signal to be substantially in coincidence with transition of the external signal.

7. The phase-locked loop according to claim 5, wherein the processing means include:

a sequencer counter, sequenced substantially in time with transitions of the external signal, for cyclically providing a set of count values associated with different states of the processing means, a first logic assembly linked to an output of the counter for providing a control pulse in response to a predetermined count value associated with the active state, and a second logic assembly linked to an output of the first logic assembly and receiving the external signal for providing, in response to the said control pulse, said control information substantially in coincidence with a transition of the external signal.

8. The phase-locked loop according to claim 7, wherein the sequencer counter includes first, second and third D-type flip-flops connected in cascade, where respective inputs of the flip-flops are connected to respective complemented output of the flip-flops, wherein a clock input of each flip-flop is linked to a complemented output of a flip-flop preceding said each flip-flop, wherein the sequencing means includes:

a first NAND logic gate having a first input receiving the external signal and a second input linked to the complemented output of the third flip-flop, said first NAND logic gate also having an output linked to a clock input of the first flip-flop, a second NAND logic gate having an output linked to respective zero-reset inputs of the first, second and third flip-flops, a first input connected to a non-complemented output of the third flip-flop and a second input for receiving said predetermined indication.

9. The phase-locked loop according to claim 8, wherein the first logic assembly includes a third NAND logic gate having first and second inputs linked respectively to non-complemented and complemented outputs of the first and second flip-flops, and a NOR logic gate having first and second inputs linked respectively to the output of the third NAND logic gate and a non-complemented output of the third flip-flop, wherein the output of the NOR logic gate being the output of the first logic assembly.

10. The phase-locked loop according to claim 7, wherein the second logic assembly includes a fourth NAND logic gate having a first input linked to the output of the first logic assembly and a second input receiving the external signal, a fourth flip-flop having a clock input linked to an output of the fourth logic gate and a zero-reset input linked to the output of the first logic assembly via a delay circuit, a fifth NAND logic gate having a first input linked to an output of the fourth flip-flop and a second input for receiving a pulse originating from an internal initialization means of the divider.

11. The phase-locked loop according to claim 5, wherein the phase comparator is capable of providing a non-coincidence signal representative of a phase non-coincidence between the internal and external signals, wherein the phase-locked loop includes a filter for filtering non-coincidence signals having a duration less than a predetermined duration, and wherein said predetermined indication is the filtered value of the non-coincidence signal.

12. The phase-locked loop according to claim 11, wherein the filter includes a fifth and a sixth flip-flop connected in cascade, the fifth flip-flop having an input receiving the non-coincidence signal, the sixth flip-flop having an input connected to a non-complemented output of the fifth flip-flop, wherein the fifth and sixth flip-flops being clocked by the clock signal of the voltage-controlled oscillator, and a sixth NAND logic gate having one input receiving the non-coincidence signal and another input being connected to an output of the sixth flip-flop, the output of the sixth logic gate being connected to another input of the second NAND logic gate of the sequencing means.

13. The phase-locked loop according to claim 5, wherein the oscillator has a frequency variation in the order of +/−100 ppM.

14. The phase-locked loop according to claim 13, wherein the oscillator is a quartz oscillator.

* * * * *